(12) United States Patent
Benveniste et al.

(10) Patent No.: US 6,664,548 B2
(45) Date of Patent: Dec. 16, 2003

(54) ION SOURCE AND COAXIAL INDUCTIVE COUPLER FOR ION IMPLANTATION SYSTEM

(75) Inventors: Victor M. Benveniste, Gloucester, MA (US); William F. DiVergilio, Beverly, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/209,397

(22) Filed: Jul. 31, 2002

(65) Prior Publication Data

US 2003/0205680 A1 Nov. 6, 2003

Related U.S. Application Data

(63) Continuation-in-part of application No. 10/136,047, filed on May 1, 2002.

(51) Int. Cl.[7] .............................................. H01J 27/06
(52) U.S. Cl. .................................................. 250/423 P
(58) Field of Search .................. 250/492.21, 423 R; 315/111.81, 111.41; 313/363.1

(56) References Cited

U.S. PATENT DOCUMENTS

| | | | |
|---|---|---|---|
| 4,447,732 A | * | 5/1984 | Leung et al. ............. 250/427 |
| 5,350,926 A | | 9/1994 | White et al. |
| 5,497,006 A | | 3/1996 | Sferlazzo et al. |
| 5,661,308 A | * | 8/1997 | Benveniste et al. ..... 250/492.21 |
| 5,760,405 A | * | 6/1998 | King et al. ............. 250/423 R |
| 5,825,038 A | | 10/1998 | Blake et al. |
| 5,834,786 A | | 11/1998 | White et al. |
| 6,016,036 A | | 1/2000 | Brailove |
| 6,060,718 A | | 5/2000 | Brailove et al. |
| 6,094,012 A | * | 7/2000 | Leung et al. ............ 315/111.81 |
| 6,124,834 A | * | 9/2000 | Leung et al. ............... 343/867 |
| 6,135,128 A | | 10/2000 | Graf et al. |
| 6,194,836 B1 | * | 2/2001 | Pacquet et al. .......... 315/111.71 |
| 6,207,963 B1 | | 3/2001 | Benveniste |
| 6,207,964 B1 | | 3/2001 | McIntyre et al. |
| 6,242,750 B1 | | 6/2001 | Takahashi et al. |
| 6,294,862 B1 | * | 9/2001 | Brailove et al. .......... 313/363.1 |

* cited by examiner

*Primary Examiner*—Jack Berman
*Assistant Examiner*—Johnnie L Smith, II
(74) *Attorney, Agent, or Firm*—Eschweiler & Associates, LLC (57) ABSTRACT

An ion source is disclosed having an elongated slit for providing a ribbon ion beam for use in an ion implantation system. The source comprises a coaxial inductive coupling antenna for RF excitation of plasma within a cylindrical source housing, as well as circumferential magnets disposed within the housing for generating azimuthal multi-cusped magnetic fields for plasma confinement. Also disclosed is a liner for the housing interior providing thermal barrier between the plasma and the outer housing wall so as to mitigate or reduce condensation within the plasma confinement chamber.

23 Claims, 10 Drawing Sheets

ION SOURCE AND COAXIAL INDUCTIVE COUPLER FOR ION IMPLANTATION SYSTEM

RELATED APPLICATION

This application is a Continuation-In-Part of Ser. No. 10/136,047, filed May 1, 2002, which is entitled "ION SOURCE PROVIDING RIBBON BEAM WITH CONTROLLABLE DENSITY PROFILE ".

FIELD OF THE INVENTION

The present invention relates generally to ion implantation systems, and more particularly to ion sources for providing ribbon beams in ion implantation systems.

BACKGROUND OF THE INVENTION

Ion implantation systems or ion implanters are widely used to dope semiconductors with impurities in integrated circuit manufacturing, as well as in the manufacture of flat panel displays. In such systems, an ion source ionizes a desired dopant element, which is extracted from the source in the form of an ion beam of desired energy. The ion beam is then directed at the surface of the workpiece, such as a semiconductor wafer, in order to implant the workpiece with the dopant element. The ions of the beam penetrate the surface of the workpiece to form a region of desired conductivity, such as in the fabrication of transistor devices in the wafer. The implantation process is typically performed in a high vacuum process chamber which prevents dispersion of the ion beam by collisions with residual gas molecules and which minimizes the risk of contamination of the workpiece by airborne particles. A typical ion implanter includes an ion source for generating the ion beam, a beamline including a mass analysis magnet for mass resolving the ion beam, and a target chamber containing the semiconductor wafer or other substrate to be implanted by the ion beam, although flat panel display implanters typically do not include a mass analysis apparatus. For high energy implantation systems, an acceleration apparatus may be provided between the mass analysis magnet and the target chamber for accelerating the ions to high energies.

Conventional ion sources include a plasma confinement chamber having an inlet aperture for introducing a gas to be ionized into a plasma and an exit aperture opening through which the plasma is extracted to form the ion beam. One example of gas is phosphine. When phosphine is exposed to an energy source, such as energetic electrons or radio frequency (RF) energy, the phosphine can disassociate to form positively charged phosphorous (P+) ions for doping the workpiece and hydrogen ions. Typically, phosphine is introduced into the plasma confinement chamber and then exposed to the energy source to produce both phosphorous ions and hydrogen ions. The plasma comprises ions desirable for implantation into a workpiece, as well as undesirable ions which are a by-product of the dissociation and ionization processes. The phosphorous ions and the hydrogen ions are then extracted through the exit opening into the ion beam using an extraction apparatus including energized extraction electrodes. Examples of other typical dopant elements of which the source gas is comprised include phosphorous (P), arsenic (As), or Boron (B).

The dosage and energy of the implanted ions are varied according to the implantation desired for a given application. Ion dosage controls the concentration of implanted ions for a given semiconductor material. Typically, high current implanters are used for high dose implants, while medium current implanters are used for lower dosage applications. Ion energy is used to control junction depth in semiconductor devices, where the energy levels of the ions in the beam determine the degree of depth of the implanted ions. The continuing trend toward smaller and smaller semiconductor devices requires a beamline construction which serves to deliver high beam currents at low energies. The high beam current provides the necessary dosage levels, while the low energy permits shallow implants. In addition, the continuing trend toward higher device complexity requires careful control over the uniformity of implantation beams being scanned across the workpiece.

The ionization process in the ion source is achieved by excitation of electrons, which then collide with ionizable materials within the ion source chamber. This excitation has previously been accomplished using heated cathodes or RF excitation antennas. A cathode is heated so as to emit electrons Which are then accelerated to sufficient energy for the ionization process, whereas an RF antenna generates electric fields that accelerate plasma electrons to sufficient energy for sustaining the ionization process. The antenna may be exposed within the plasma confinement chamber of the ion source, or may be located outside of the plasma chamber, separated by a dielectric window. The antenna is energized by an RF alternating current which induces a time varying magnetic field within the plasma confinement chamber. This magnetic field in turn induces an electric field in a region occupied by naturally occurring free electrons within the source chamber. These free electrons accelerate due to the induced electric field and collide with ionizable materials within the ion source chamber, resulting in plasma currents within the ion chamber, which are generally parallel to and opposite in direction to the electric currents in the antenna. Ions can then be extracted from the plasma chamber by one or more energizable extraction electrodes located proximate a small exit opening, so as to provide a small cross-section (relative to the size of the workpiece)ion beam.

In many ion implantation systems, a cylindrical ion beam is imparted onto a wafer target through mechanical and/or magnetic scanning, in order to provide the desired implantation thereof. Batch implanters provide for simultaneous implantation of several wafers, which are rotated through an implantation path in a controlled fashion. The ion beam is shaped according to the ion source extraction opening and subsequent shaping apparatus, such as the mass analyzer apparatus, resolving apertures, quadrupole magnets, and ion accelerators, by which a small cross-section ion beam (relative to the size of the implanted workpiece) is provided to the target wafer or wafers. The beam and/or the target are translated with respect to one another to effect a scanning of the workpiece. However, in order to reduce the complexity of such implantation systems, it is desirable to reduce the scanning mechanisms, and to provide for elongated ribbon-shaped ion beams. For a ribbon beam of sufficient longitudinal length, a single mechanical scan may be employed to implant an entire wafer, without requiring additional mechanical or magnetic raster-type scanning devices. Accordingly, it is desirable to provide ribbon beam ion sources providing an elongated ion beam with a uniform longitudinal density profile for use in such implantation systems.

SUMMARY OF THE INVENTION

The present invention is directed to ion sources for ion implantation systems, by which an elongated or ribbon-shaped ion beam of uniform or controllable density may be provided for implanting a workpiece, such as a semiconductor wafer or flat-panel display. The invention provides ion sources in which a uniform plasma is provided within an elongated plasma confinement chamber, from which a ribbon-shaped ion beam is extracted through an elongated exit opening or extraction slit, having a relatively large aspect ratio. The elongated ribbon beam may then be used for implantation of semiconductor wafers in a single mechanical scan, thereby simplifying the implantation system. In one implementation, the invention can be employed to provide ribbon beams up to 400 mm in length, so as to facilitate single scan implantation of 300 mm semiconductor wafer workpieces.

In order to control the uniformity of the extracted ion beam, the invention advantageously provides coaxial RF excitation within a generally cylindrical source chamber to facilitate uniform generation of ionized plasma therein. Uniform plasma confinement within the plasma chamber is further enhanced through provision of circumferentially extending multi-cusp magnets providing azimuthal magnetic fields within the plasma chamber. An elongated exit opening or extraction slit is then provided in the plasma chamber for extraction using elongated energizable extraction electrodes to form a ribbon beam. The uniformity of the ions within the plasma chamber, in turn facilitates the provision of a uniform ribbon beam for uniformly implanting a wafer target having high feature density and small feature sizes. In addition, a thermal barrier, such as a cylindrical liner may be provided within the plasma chamber, which can rise to the plasma temperature, in order to mitigate condensation within the plasma chamber. This facilitates changeover from one implantation species to another without contamination from condensate common in prior RF excited ion (e.g., "cold wall") sources.

One aspect of the invention provides an ion source, comprising a housing with a cylindrical plasma confinement chamber disposed along a longitudinal axis in which a plasma is generated, an antenna coaxially disposed in the plasma chamber along the axis, and an RF source for energizing the antenna. The housing comprises a cylindrical electrically conductive chamber wall extending longitudinally between first and second ends, with an elongated longitudinally extending exit opening through which an ion beam may be extracted from the plasma. The elongated exit opening may be of any longitudinal length, for example, such as about 400 mm, and may have a high aspect ratio to provide an elongated ribbon-shaped ion beam. The antenna comprises first and second terminals, with the first terminal being connected to the RF source and the second terminal being electrically connected to the chamber wall at the second end, where the chamber wall provides a return path for the RF source. A portion of the antenna between the first and second terminals extends longitudinally within the plasma confinement chamber along the axis for emitting energy into the plasma chamber.

The coaxial antenna thus facilitates uniform excitation of the plasma to provide a uniform ion source from which a ribbon beam may be extracted. The RF source has two outputs, including a first output connected to the first antenna terminal and a second output connected to the first end of the chamber wall. In this manner, the RF source, the antenna, and the chamber wall form a substantially coaxial electrical circuit to provide an alternating electric current in the exposed portion of the antenna for inducing an ionizing electric field within the plasma confinement chamber. Capacitors may be provided between the first RF source output and the antenna first terminal, and/or between the second end of the chamber wall and the second antenna terminal.

Another aspect of the invention provides an ion source for providing an ion beam in an ion implantation system, which comprises a housing defining a cylindrical plasma confinement chamber disposed along a longitudinal axis. The housing comprises a generally cylindrical electrically conductive chamber wall with an elongated longitudinally extending exit opening, and an antenna partially extending within the plasma confinement chamber for emitting energy therein. A plurality of magnets are provided, which are radially spaced from the axis within the plasma confinement chamber and longitudinally spaced from one another. Adjacent magnet pairs are of opposite magnetic polarity so as to create longitudinal magnetic fields near the chamber wall for confinement of plasma within the plasma confinement chamber. In one implementation, the magnets are permanent magnets individually extending circumferentially around a portion of the interior of the chamber wall between opposite sides of the exit opening.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

The present invention will now be described with reference to the drawings wherein like reference numerals are used to refer to like elements throughout. The invention provides an ion source apparatus for creating elongated ion beams in an ion implantation system having a controllable density profile and other novel features for enhancing uniformity of ionized plasma within the source. One implementation of the various aspects of the invention is hereinafter illustrated and described. However, it will be appreciated that the illustrations and descriptions thereof are exemplary in nature, and that one or more aspects or novel features of the present invention may be carried out in other systems apart from those illustrated and described herein.

Referring initially to FIGS. 1A–1C and FIG. 2A, an ion source 2 is generally illustrated in accordance with the present invention, which may be used to create an elongated ribbon beam for use in an ion implantation system. The source comprises a housing 4 defining an elongated, generally cylindrical plasma confinement chamber 6 disposed along a longitudinal axis 8 in which a plasma is generated by ionizing a source material, such as phosphine (PH3), phosphorous (P), arsenic (As), Boron (B), or the like (not shown). The housing 4 comprises a generally cylindrical, electrically conductive chamber wall 10 extending longitudinally between first and second ends 14 and 16, respectively, with an elongated longitudinally extending exit opening or extraction slit 18 through which an ion beam may be extracted from the plasma. The opening 18 provides access for an extraction apparatus to the plasma confined within the chamber 6, such that a ribbon-shaped beam of considerable length (e.g., 400 mm) can be extracted therefrom in a uniform or controllable manner.

One aspect of the invention provides for coaxial excitation of the plasma within the chamber 6 so as to facilitate plasma uniformity in the source 2. Toward that end, the illustrated ion source 2 employs an antenna 20 comprising first and second terminals 20a and 20b, respectively, which is coaxially located along the longitudinal axis 8. The coaxial or concentric location of the antenna 20 and the conductive chamber wall 10 facilitates uniformity in the plasma along the longitudinal length of the source 2. The first terminal 20a is connected to an RF plasma oscillator source 22 at the first end 14 and the second terminal 20b is electrically connected to the chamber wall 10 at a termination point 21 at the second end 16, wherein the terminals 20a and 20b are AC coupled using capacitors 24a and 24b, respectively.

The chamber 6 is maintained in a vacuum, using bushings 27 between the inner portion of the antenna and the capacitors 24. The antenna 20 has an inductance L, and together with the capacitors 24, forms a resonant circuit to provide RF excitation to the source gas to generate a plasma in the chamber 6, wherein one output of the RF source 22 is connected to the antenna terminal 24a, and the other is connected to a termination point 23 at the first end 14 of the wall 10. The RF source 22, the antenna 20, the capacitors 24 and the conductive chamber wall 10 thus form a substantially coaxial electrical circuit to provide an alternating electric current in the exposed portion of the antenna 20 for inducing an electric field within the plasma confinement chamber 6. The combination of the antenna 20 and the capacitors 24 form a series resonant circuit at the frequency of the RF source 22. As a result, the voltage across this circuit is minimized. To the extent that the capacitors 24 are of equal value, the voltage at the center of the antenna 20 is also minimized. This is desirable, in order to minimize sputtering of the antenna 20 (or antenna shield) material.

A central portion of the antenna 20 between the terminals 20a and 20b extends longitudinally along the axis 8 for coupling energy into the chamber 6, whereby an AC RF current through the antenna 20 creates a time varying magnetic field within the plasma confinement chamber 6. The magnetic field in turn induces an electric field in a region (initially) occupied by naturally occurring free electrons within the chamber 6, which are accelerated as a result. The accelerated electrons, in turn, collide with ionizable materials, resulting in more electrons being generated, which are also accelerated by the RF fields, until a plasma is established. In a steady state, the RF induced ionization compensates for plasma lost to the chamber walls as a result of imperfect confinement, as well as other loss mechanisms. Plasma currents in the chamber 6 are generally parallel to and opposite in direction to the electric currents in the antenna 20.

In another variation, the antenna is surrounded by an insulating tube that may form the vacuum partition, instead of bushings 27. In this case the antenna and capacitors remain at atmospheric pressure, isolated from the plasma. This configuration allows a wider choice of antenna material (without concerns of plasma contamination) and minimizes the capacitance between the antenna and the plasma. Although the exemplary source 2 comprises a cylindrical plasma confinement chamber 6, other elongated generally cylindrical shapes are possible within the scope of the present invention. As used herein, the term generally cylindrical includes such other elongated shapes in which a coaxial excitation antenna can be configured to provide uniform plasma excitation for extraction of an elongated ribbon-shaped ion beam.

Figure 1A:
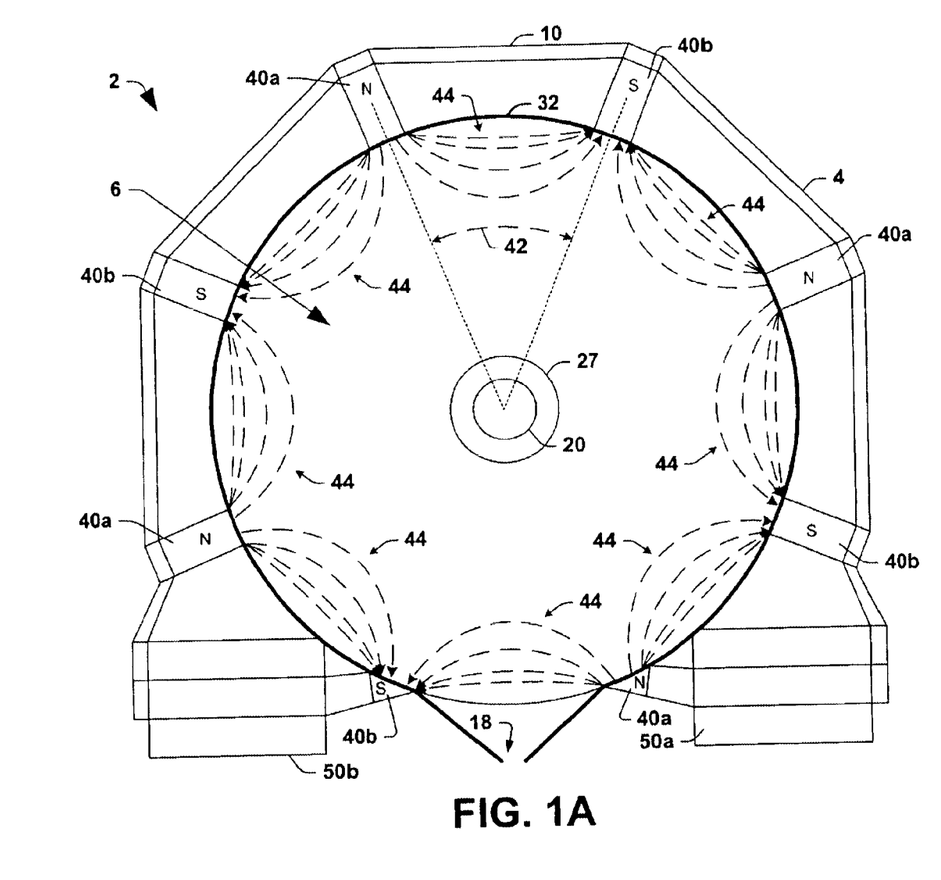
FIG. 1A is an end elevation view in section illustrating an exemplary ion source having a coaxial inductive excitation antenna in accordance with one aspect of the present invention.
Figure 1B:
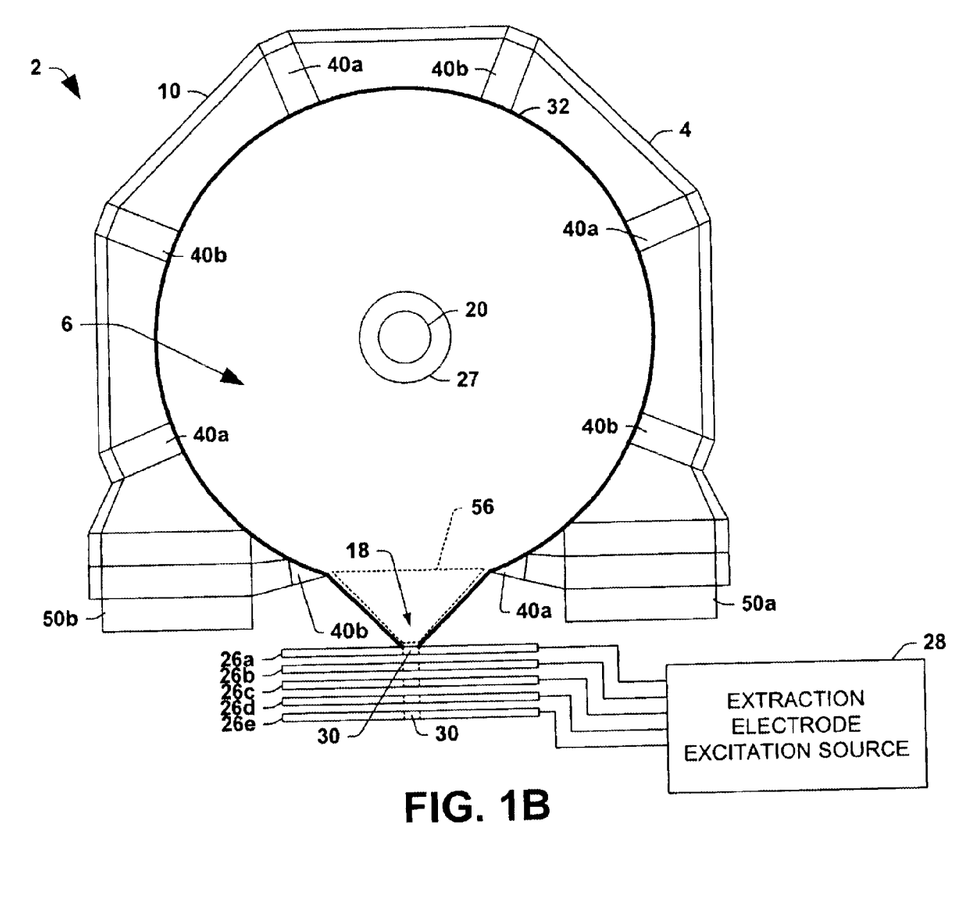
FIG. 1B is another end elevation view in section illustrating the ion source of FIG. 1A with a series of extraction electrodes located near the exit opening.

FIGS. 1A and 1B illustrate one implementation of the source 2 in which longitudinally extending permanent magnets 40 are located in the source to provide multi-cusped plasma confinement fields in the chamber 6. FIGS. 1C–5 illustrate another implementation of the source 2 employing circumferentially extending permanent magnets 46 for generating azimuthal confinement fields in the chamber 6. As will be described further below, such plasma confinement magnetic fields can be generated near the interior walls of the chamber 6 to confine the plasma of interest to specific regions in the chamber 6. Ions from the plasma can then be extracted in a pre-extraction region 56 by one or more energizable extraction electrodes 26a–26e located proximate the exit opening 18 (FIGS. 1B and 1C), so as to provide a generally ribbon-shaped ion beam, where the electrodes 26 are energized using a power source 28. The electrodes 26 comprise elongated extraction slits 30 through which the beam is extracted, thereby providing a ribbon-shaped beam having a large aspect ratio. Any appropriate extraction apparatus may be used in accordance with the invention, and it is noted that the extraction electrodes 26 and the slits 30 therethrough are not necessarily drawn to scale. In addition, the inductance L of the antenna 20 and the capacitances of the capacitors 24 may be selected to provide a resonance condition at any appropriate RF frequency, and any conventional RF source 22 may be employed in order to carry out the various aspects of the invention.

Figure 1C:
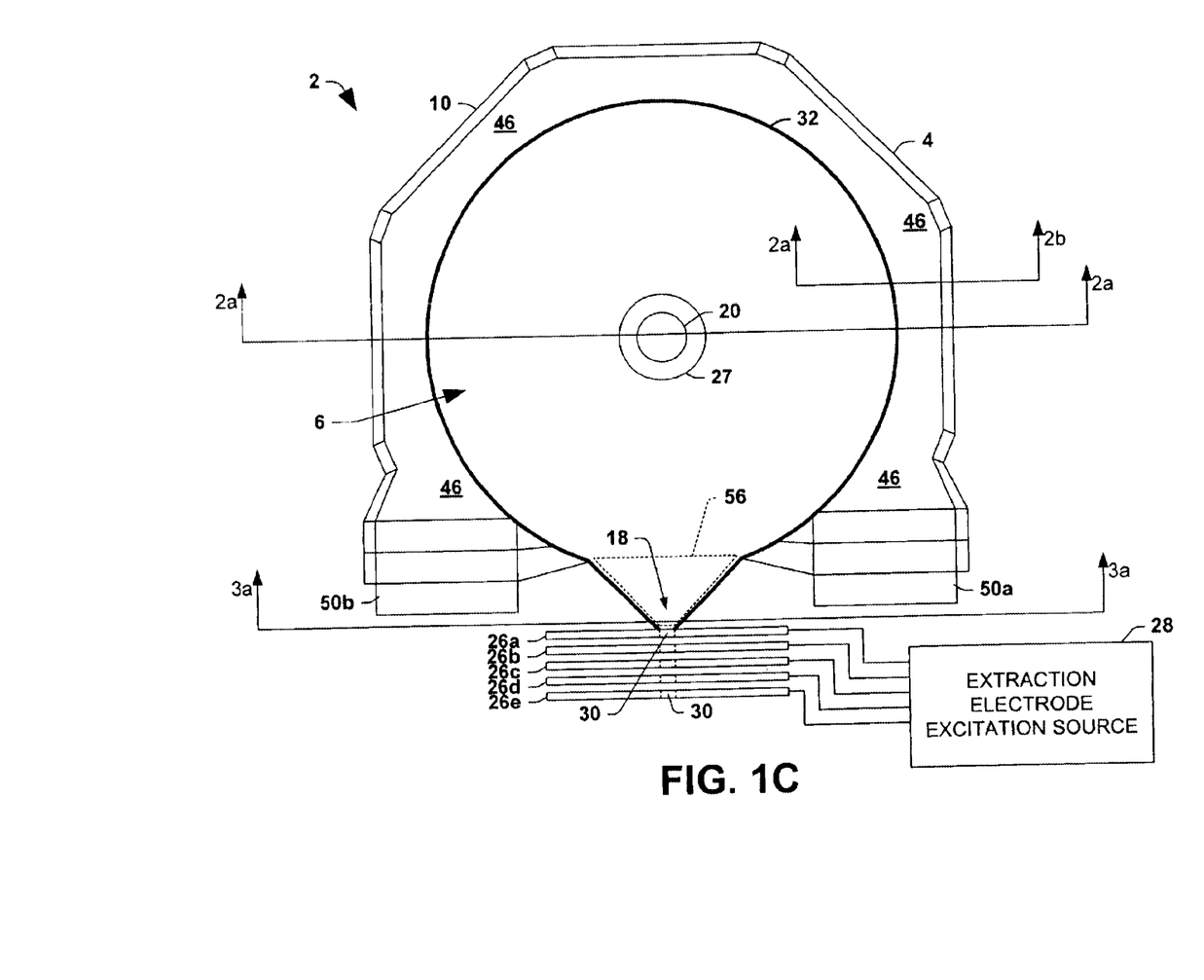
FIG. 1C is an end elevation view in section illustrating another exemplary ion source having a coaxial inductive excitation antenna in accordance with the invention.
Figure 2A:
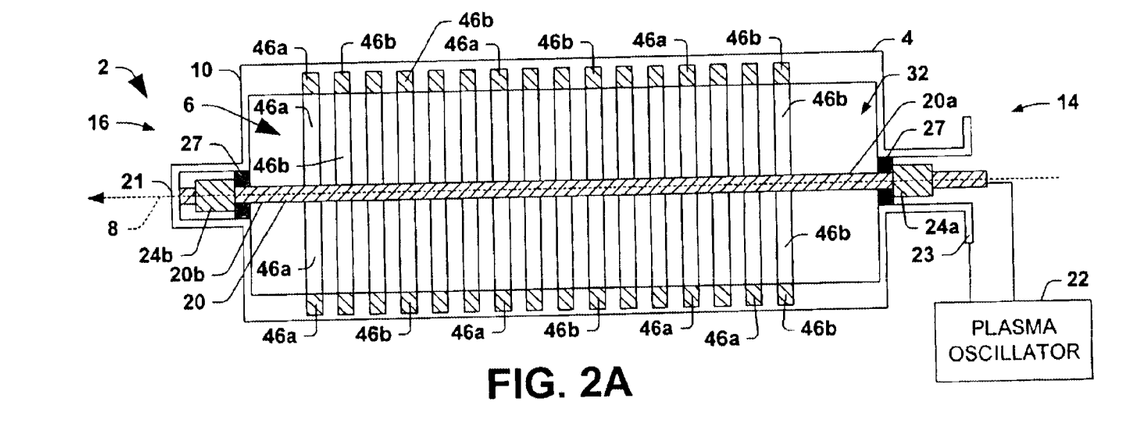
FIG. 2A is a bottom plan view in section taken along line 2a—2a of FIG. 1C, illustrating the coaxial inductive excitation antenna and circumferentially disposed plasma confinement magnets arranged for creating azimuthal magnetic fields within the chamber according to another aspect of the invention.
Figure 2B:
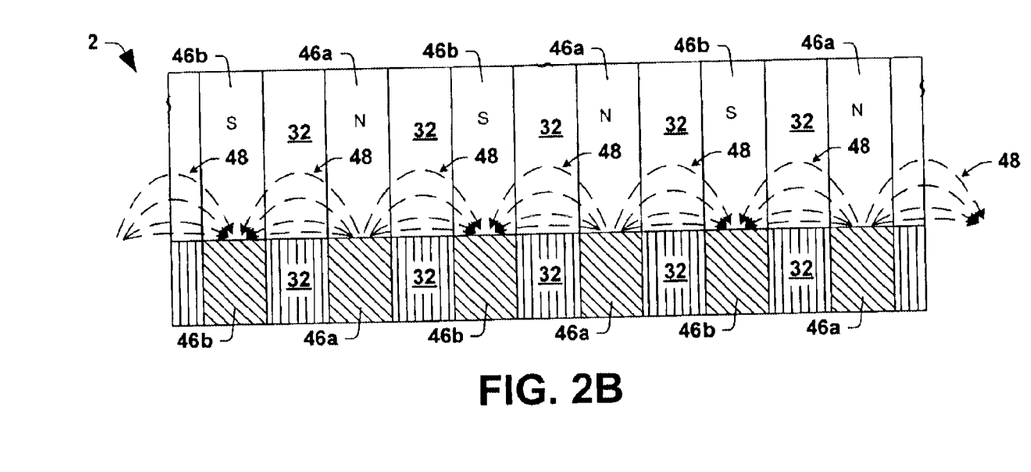
FIG. 2B is a partial bottom plan view in section taken along line 2b—2b of FIG. 1C, illustrating further details of the plasma confinement magnets and the azimuthal magnetic fields in the plasma confinement chamber.
Figure 2C:
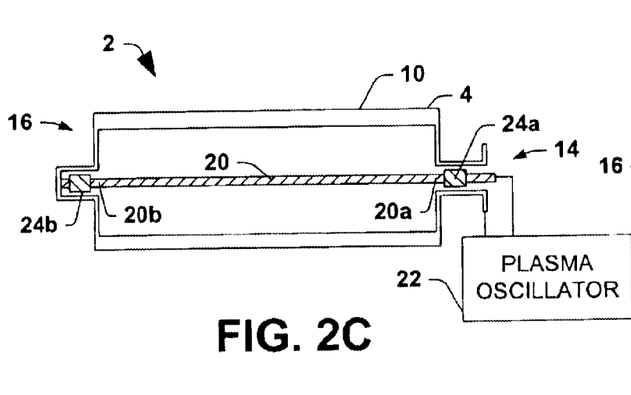
FIG. 2C is a simplified bottom plan view in section illustrating one implementation of a coaxial excitation antenna capacitively coupled at both ends according to another aspect of the invention.
Figure 2D:
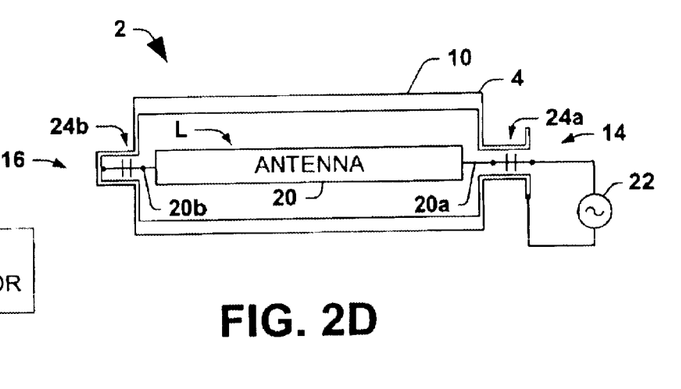
FIG. 2D is a simplified bottom plan view schematically illustrating the electrical circuit of the coaxial excitation antenna of FIG. 2C.
Figure 2E:
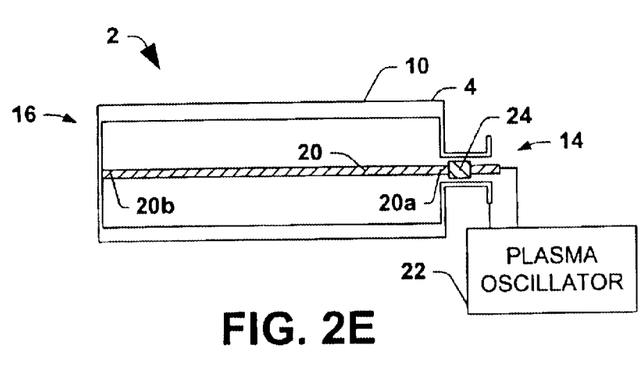
FIG. 2E is a simplified bottom plan view in section illustrating another exemplary implementation of a coaxial excitation antenna capacitively coupled at one end.
Figure 2F:
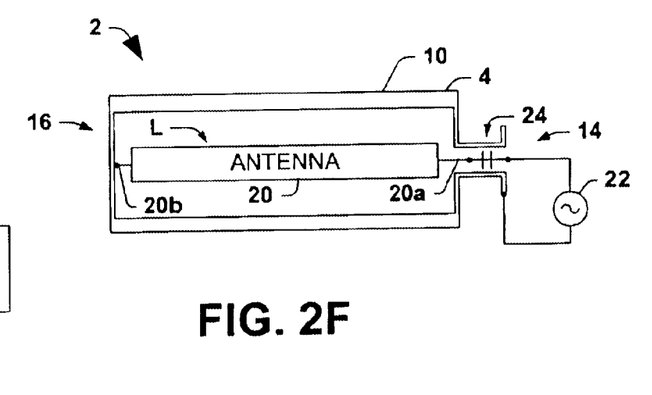
FIG. 2F is a simplified bottom plan view schematically illustrating the electrical circuit of the coaxial excitation antenna of FIG. 2E.

Referring also to FIGS. 2C–2F, the capacitive coupling of the antenna 20 with the power source 22 may be accomplished in a variety of ways in accordance with the invention. One configuration is shown in a simplified illustration in FIG. 2C (e.g., similar to that of FIG. 1C) and schematically in FIG. 2D. This configuration advantageously allows the center of the antenna 20 operate at very close to RF ground (e.g., a virtual ground), whereby the uniformity of power coupling to the plasma is enhanced. Thus, the antenna configuration facilitates uniform beam extraction by helping to ensure that ionized plasma is available in sufficient amounts along the longitudinal length of the plasma chamber 6. Also, there is no DC path from the antenna 20 to ground in FIGS. 2C and 2D, which prevents undesirable depletion of the plasma current in the source 2. Another possible configuration is illustrated in FIGS. 2E and 2F, wherein a single capacitor 24 is provided at the first end 14, with the second terminal 20b of the antenna 20 being grounded (e.g., by welding) to the second end 16 of the wall 10. Other configurations are possible within the scope of the invention, apart from those illustrated and described herein.

Referring back to FIGS. 1C and 2A, the exemplary ion source 2 further comprises an inner liner 32 providing a cylindrical inner surface to the housing 4, and creating a thermal barrier between the plasma in the confinement chamber 6 and the conductive wall 10. Excitation of the plasma within the chamber 6 heats the plasma. In the past, the inner walls of the plasma chamber stayed relatively cool, whereby longitudinally extending permanent magnets could operate properly. However, this temperature gradient between the wall and the plasma caused condensation. When the ion source was subsequently changed over to accommodate a different implantation species, condensation of materials from the previous source gas remained as a contaminant. In accordance with the present invention, the liner 32 is allowed to rise to the temperature of the gas in the interior of the chamber 6 (e.g., about 600 degrees F), thus mitigating such condensation.

In this regard, the conductive chamber wall 10 is made of aluminum, whereas the liner 32 is preferably made of tungsten or other like materials. Because the chamber 6 is operated in a vacuum, there is very poor thermal connection between the liner 32 and the wall 10, and consequently there is very little thermal conductivity therebetween. Thus, for example, when used with arsenic source material, the arsenic will remain in vapor form, and will not condense on the liner 32. Other materials may be employed for the liner 32. However, tungsten is used in the illustrated ion source 2 because the mass of tungsten is far above that of typical implantation materials, and consequently it will be separated by subsequent mass analysis, and is therefore unlikely to contaminate the beam imparted onto the ultimate implantation target.

As illustrated in FIGS. 1A and 1B, the ion source 2 may also comprise longitudinally extending permanent magnets 40 circumferentially spaced from one another by an angle 42 of about 45 degrees, having alternating North and South magnetic pole faces generally flush with the inner surface of the liner 32. The magnets 40a have north polarity poles facing the interior of the chamber 6, and magnets 40b have South poles facing the interior. Thus positioned, the longitudinally extending magnets 40 provide multi-cusped magnetic fields 44 illustrated in FIG. 1A. The fields 44 are concentrated generally near the inner surface of the liner 32, thereby confining the ionized plasma away from the liner 32, resulting in concentration or radial confinement of the ionized plasma towards the center of the plasma chamber 6. As described in greater detail below, the ion source 2 also comprises pairs of electro-magnets 50 providing individually adjustable magnetic fields in an pre-extraction region 56 of the chamber 6 for controlling the density profile of the beam extracted from the source 2.

Referring now to FIGS. 1C, 2A, and 2B, another aspect of the invention provides azimuthal magnetic confinement fields 48 near the inner surface of the liner 32 using a plurality of circumferentially extending permanent magnets 46 radially spaced from the axis 8 in the chamber 6 and longitudinally spaced from one another, wherein magnets 46a have North poles facing the axis 8 and magnets 46b have South poles facing the axis 8. The magnets 46 are configured as illustrated in FIGS. 2A and 2B so as to form adjacent pairs of opposite magnetic polarity. The adjacent pairs operate to create azimuthal magnetic fields 48 near the liner 32 for confinement of plasma within the plasma confinement chamber 6. Alternatively, a single row of magnets (North or South) may be used, with a passive return yoke on the opposite side. The magnets 46 provide relatively low magnetic field strength at the center of the chamber 6 (e.g., along the axis 8), with higher field strength at the liner 32. In this manner, a strong gradient is established from the edge of the liner 32 to the axis 8. This gradient allows plasma to move freely near the center of the cylindrical chamber 6, while tending to confine the ionized plasma toward the center and away from the liner 32. This freedom of movement in the center of the chamber 6 advantageously enhances the uniformity of the plasma along the longitudinal length of the source 2.

It is noted at this point that the angular spacing of the longitudinally extending magnets 40 of FIGS. 1A and 1B (e.g., angle 42 of about 45 degrees) is symmetric for the illustrated source 2. A smaller angle between magnets 40 can be used over most of the perimeter, except near the exit opening 18. The asymmetry caused by the interruption of the cusp fields 44 at the extraction, results in a large field penetration toward the center of the source 2. Thus, the pitch of the longitudinally extending confinement magnets 40 is limited. However, there is no limitation to the number or closeness of the circumferentially extending magnets 46 of FIGS. 1C–5. Thus, any number of such magnets 46 may be provided in accordance with the invention, whereby any desired confinement magnetic field profile can be achieved within the interior of the source 2. As a result, the magnetic field gradient can be designed to any desired value near the liner 32 by using the magnets 46. Thus, although illustrated as having 16 such magnets 46, any number of such magnets is contemplated within the scope of the invention, by which better confinement control can be achieved, particularly near the exit opening 18. Moreover, although illustrated as extending circumferentially around the entire periphery of the liner 32, other configurations of such magnets 46 (not shown) are contemplated as falling within the scope of the present invention.

Although the exemplary implementation illustrated and described herein comprises both longitudinally extending confinement magnets 40 and circumferentially extending magnets 46, the azimuthal fields 48 may be provided separately or in combination with the confinement fields 44 created by the magnets 40. In this regard, it will be appreciated that ion sources within the scope of the present invention can include any combination of magnets 40 and/or 46. In addition, while the exemplary ion source 2 combines circumferentially extending magnets 46 in combination with the coaxial excitation antenna 20, other implementations are contemplated within the scope of the present invention having one or both of these features or equivalents thereof.

Figure 3A:
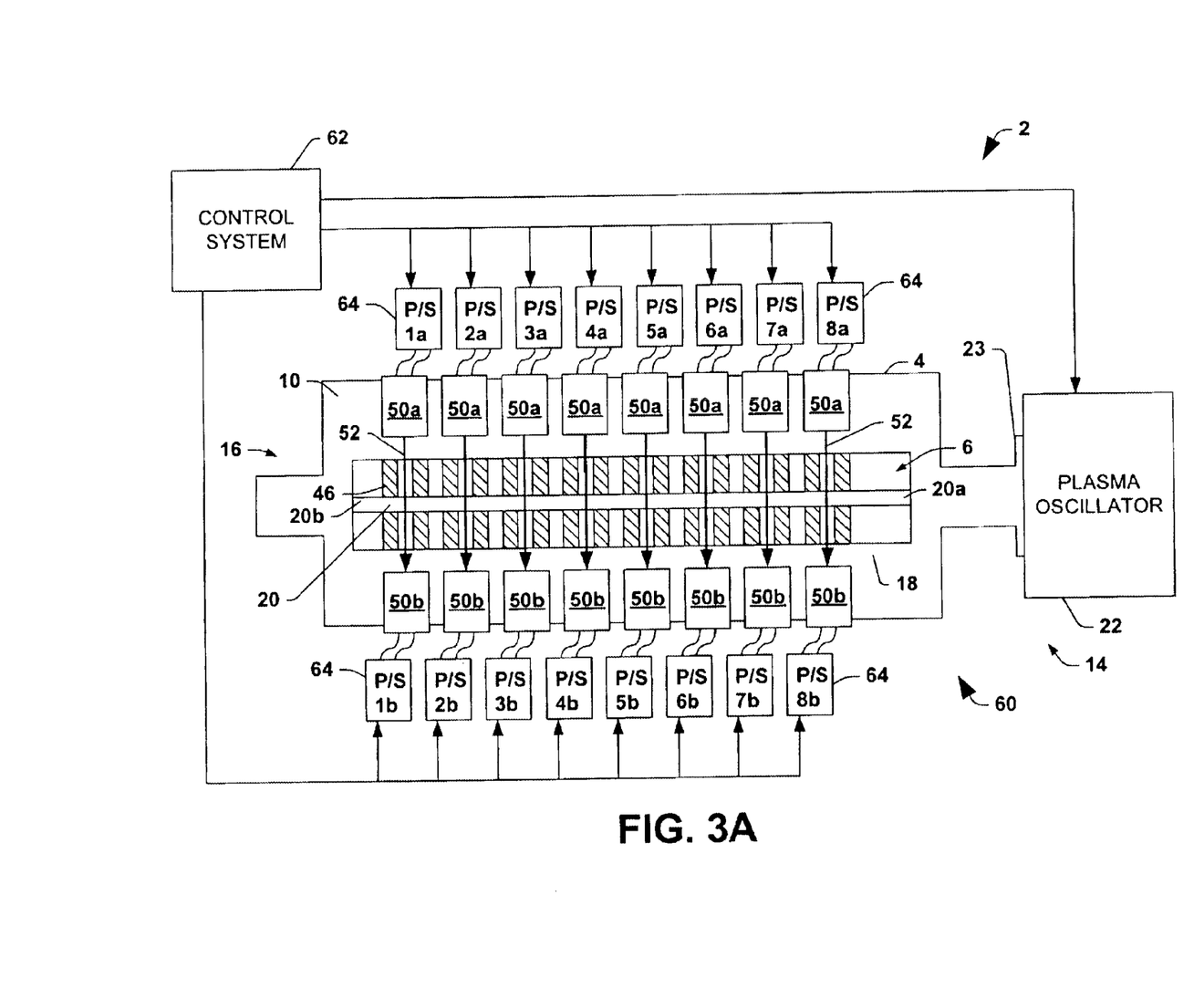
FIG. 3A is a bottom plan view taken along line 3a—3a of FIG. 1C, illustrating a density profile control apparatus for selectively adjusting a density profile associated with an elongated longitudinal ion beam being extracted from an ion source plasma confinement chamber according to another aspect of the invention.
Figure 3B:
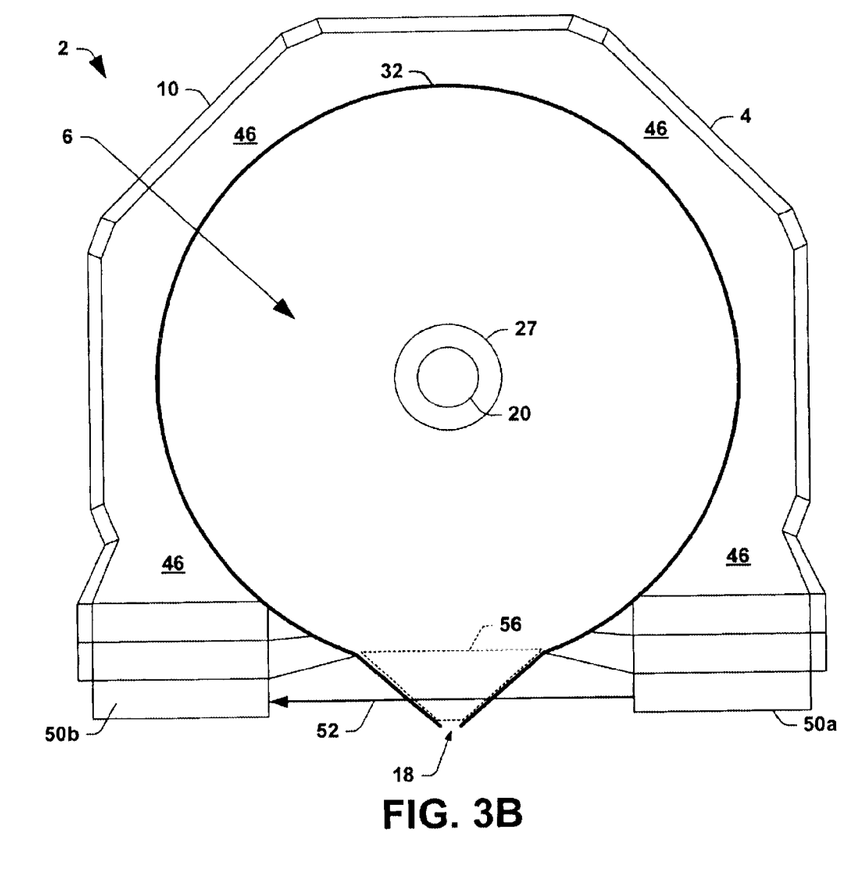
FIG. 3B is an end elevation view in section of the ion source of FIG. 3A, illustrating adjustable magnetic fields created by the density profile control apparatus.
Figure 5:
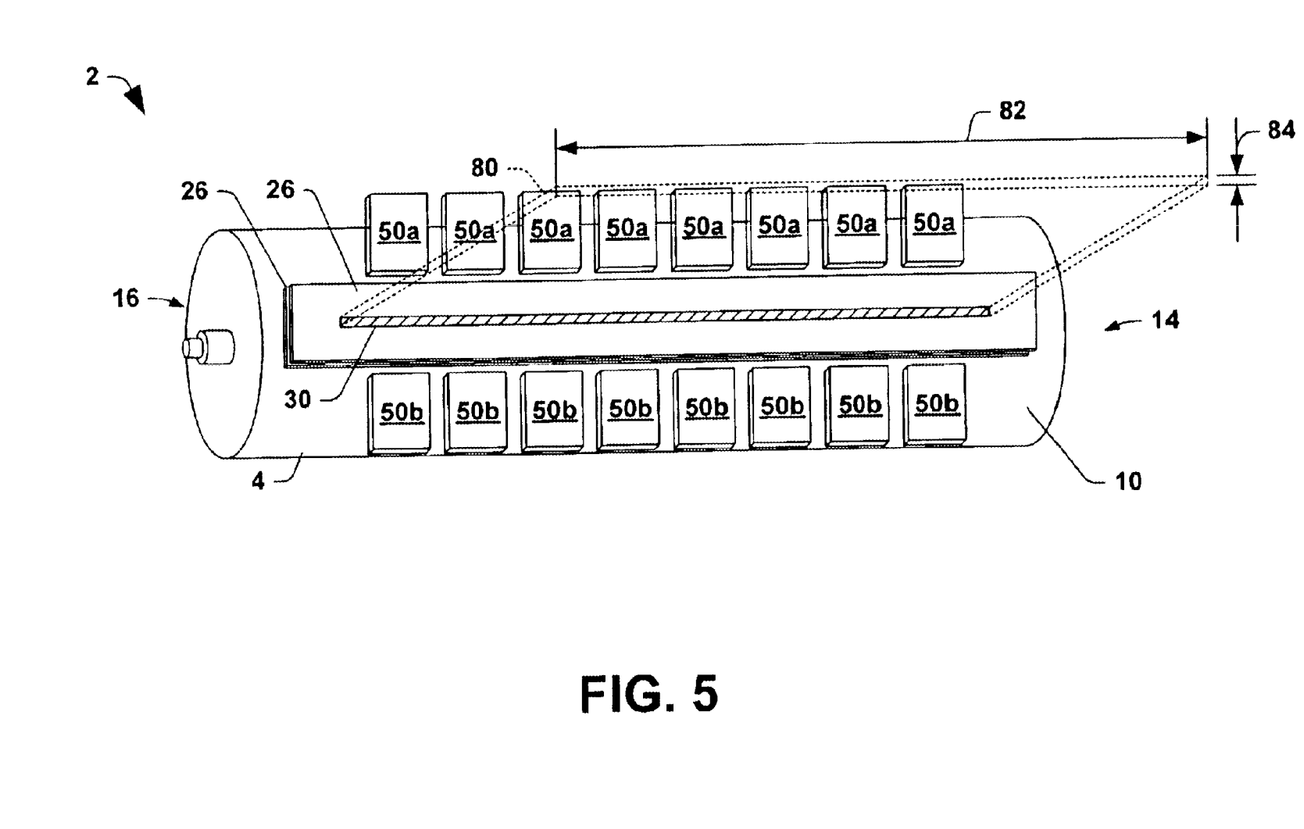
FIG. 5 is a simplified perspective view of the exemplary ion source illustrating an elongated ribbon-shaped ion beam extracted therefrom in accordance with the invention.

Referring now to FIGS. 3A, 3B, and 5, another aspect of the invention provides control apparatus 60 for selectively adjusting a density profile associated with an elongated longitudinal ion beam being extracted from the plasma confinement chamber 6. The density profile adjustment features of the invention may be employed in association with any ribbon beam source, including but not limited to those illustrated and described herein. Moreover, the profile adjustment features may be employed separately or in combination with the coaxial excitation and/or azimuthal confinement features illustrated and described above, in accordance with the invention. The control apparatus 60 comprises a plurality of magnet pairs proximate the extraction exit opening 18 and the pre-extraction region 56 through which a ribbon beam is extracted from the ion source 2.

The magnet pairs individually comprising upper and lower electro-magnets 50a and 50b having energizable windings through which current may be conducted in a controlled fashion so as to provide adjustable magnetic fields 52 between the magnets 50a and 50b. The magnets 50a and 50b are disposed on either side of the exit opening 18 to provide adjustable magnetic fields 52 in a pre-extraction region 56 inside of the chamber 6 near the exit opening 18 so as to adjust the density profile of an extracted ribbon beam. The electro-magnets 50 are energized such that first magnets 50a provide magnetic poles of a first magnetic polarity (e.g., North in the illustrated example) facing the second magnets 50b, and the second magnets 50b provide magnetic poles of an opposite second magnetic polarity (South) facing the first magnets 50a. In this fashion, the magnets 50a and 50b of each magnet pair cooperate to provide the adjustable magnetic fields 52 in the pre-extraction region 56. The magnet pairs 50a and 50b are located on the housing 4 of the source 2, although other locations are contemplated within the scope of the invention, by which selectively variable or adjustable magnetic fields are provided in a pre-extraction region near the extraction electrodes 26.

In the exemplary source 2, eight such magnet pairs 50 are illustrated. However, any number of such magnet pairs 50 may be provided in accordance with the invention. Moreover, other types of magnets may be used (e.g., such as permanent magnets), by which a plurality of adjustable magnetic fields can be achieved for controlling the profile of the ribbon beam. As shown in FIGS. 3A and 5, the magnetic fields 52 associated with individual magnet pairs 50 may be individually adjusted using a control system 62 providing control signals to DC power supplies 64 to energize coil windings associated with the individual electromagnets 50. The control system 62 is connected to the power sources 64 to individually control the currents supplied to the magnet pairs so as to individually adjust the magnetic fields 52 produced by the magnet pairs in the pre-extraction region 56 according to a desired density profile for the extracted ion beam. This control over the individual fields 52 allows selective restriction on the amount of ionized plasma available at the pre-extraction region 56, wherein increasing the magnetic field 52 associated with a given magnet pair 50 reduces the amount of plasma flow out of the chamber proximate that pair.

Thus, in the illustrated implementation, the longitudinal length of the source 2 (e.g., the width of the resulting ribbon beam) is segmented into eight portions or slices, each being associated with a magnet pair 50a, 50b. The ability to selectively restrict plasma flow out of the exit opening 18 for each of the slices allows control over the density profile of the resultant beam as it is extracted from the plasma chamber 6 at the pre-extraction region 56. Control may be performed according to a desired profile at the source 2, or according to a desired profile downstream at an implantation target (not shown) using known control algorithms, including but not limited to feedback, feed-forward, predictive or other types. This provides utility, for example, in correcting or compensating for non-uniformities in the source 2 or in subsequent (e.g., downstream) apparatus in an overall implantation system. For instance, although the uniformity of the beam at the pre-extraction region 56 may be acceptable, some or all of the magnet pairs 50a, 50b may be employed so as to compensate for non-uniformities in subsequent mass analysis or acceleration stages between the source 2 and a target wafer or panel display (not shown). In this regard, the control system 62 may further comprise ion detectors, such as Faraday cups, located near the pre-extraction region 56, and/or near a workpiece being implanted (not shown).

Thus, an implantation system employing the source 2 and the density profile control apparatus 60 may be provided with appropriate sensors and feedback devices (not shown) to measure the beam profile as it is imparted on the target workpiece, and to provide corresponding measurement signals to the control system 62. The control system 62, in turn, may make appropriate adjustments to energize the electro-magnets 50 (e.g., using the power supplies 64) so as to correct or compensate for any deviations from the desired profile at the workpiece. Alternatively, the power supplies 64 may be manually adjustable, and further may be incorporated into a single supply with separate outputs for the individual magnet pairs. Moreover, the magnets 50a and 50b of the individual magnet pairs may be energized by the same current, such that a single (e.g., adjustable) supply is employed for each magnet pair.

Figure 4A:
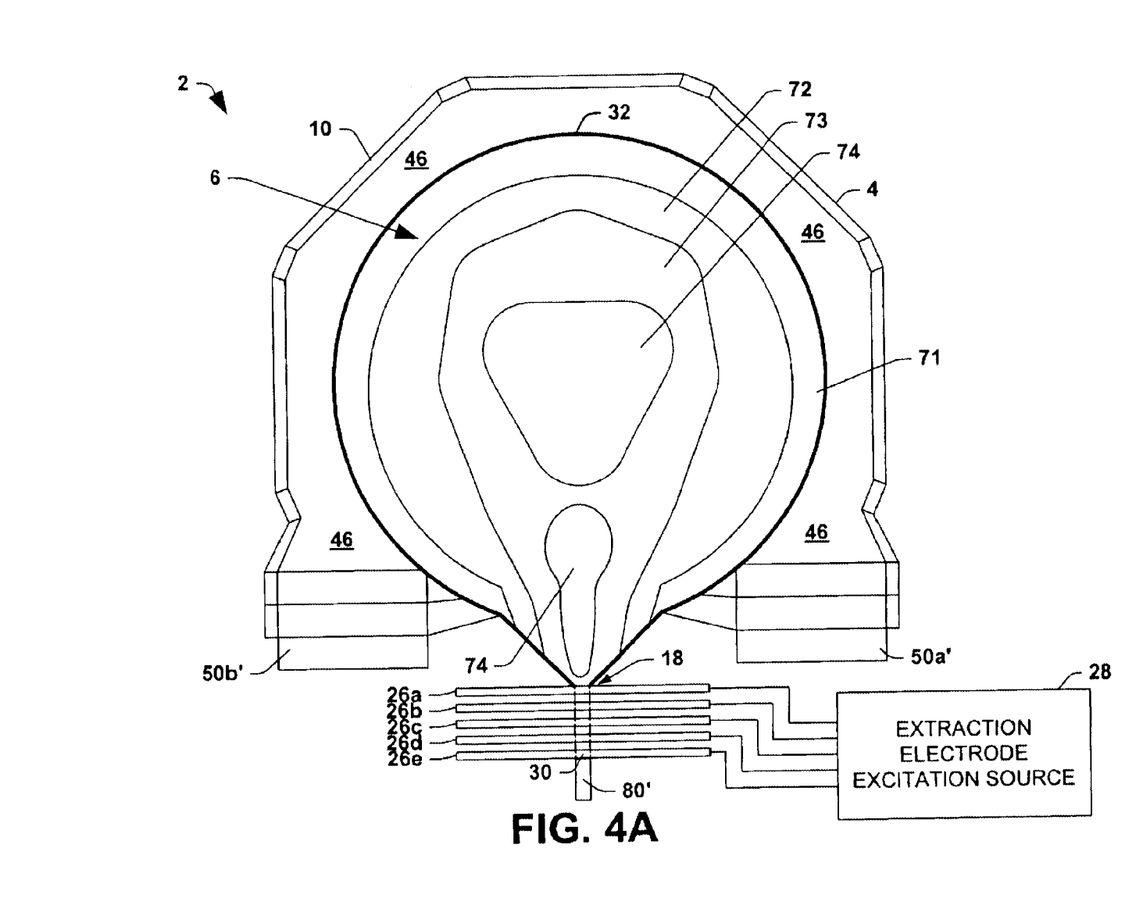
FIGS. 4A and 4B are end elevation views in section of the ion source of FIGS. 3A and 3B, illustrating magnetic field contours in the plasma confinement chamber for two different settings of the density profile control apparatus.
Figure 4B:
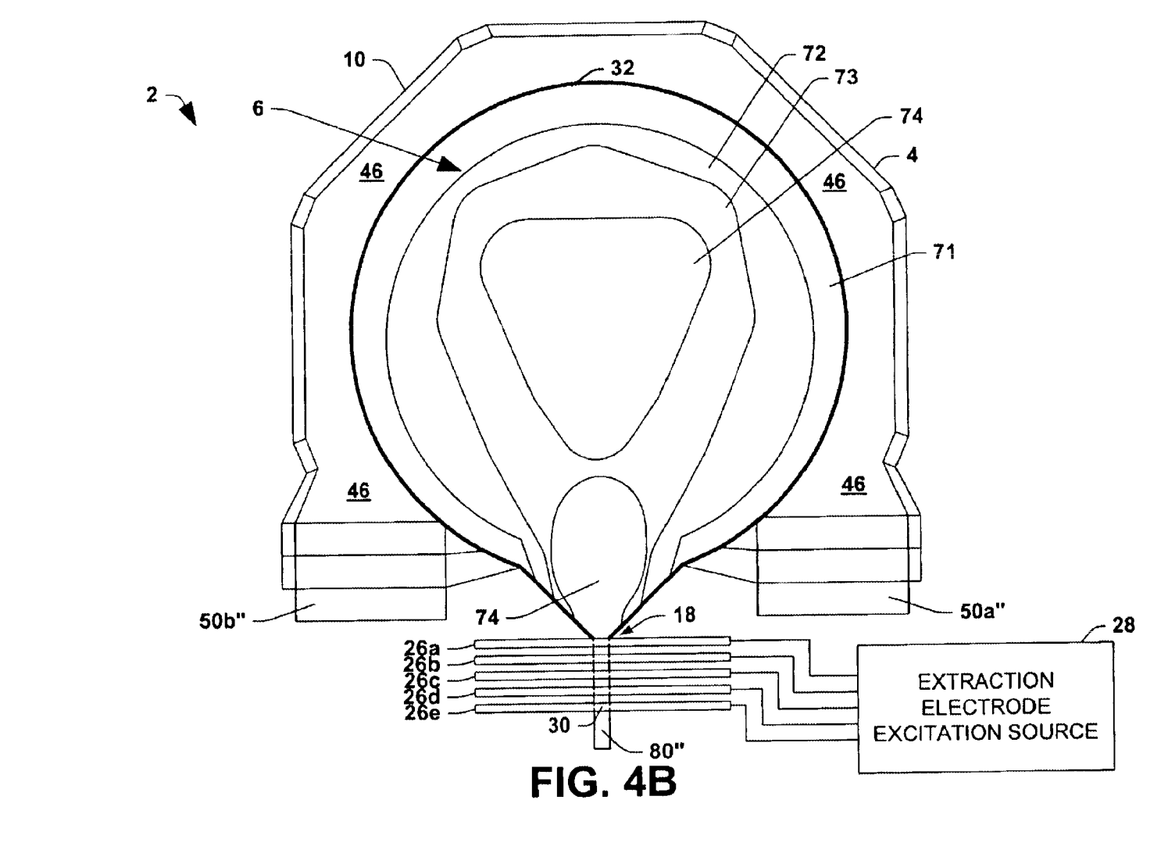

Turning now to FIGS. 4A and 4B, the operation of the profile control apparatus 60 is further illustrated, wherein two slices or longitudinal portions of the source 2 are illustrated in section with different electro-magnet adjustment levels. FIG. 4A illustrates a magnet pair comprising magnets 50a' and 50b' energized to a first level, so as to provide a first level of restriction to the extraction of ions from the chamber 6 by the extraction electrodes 26. Magnetic field contours are illustrated for four regions 71, 72, 73, and 74 of differing magnetic field strength, wherein a relatively high field strength is provided in region 71 near the liner 32, with successively lower field strengths in regions 72, 73, and 74. As described above, the field strengths in the regions 72–74 are the cumulative result of the azimuthal fields created by the circumferential confinement magnets 46, as well as the control fields 52 provided by the electromagnets 50a' and 50b' in the illustrated slice of FIG. 4A. It is noted that where the magnetic fields are weakest (e.g., in regions 74), that the density of ionized plasma will be greatest in the chamber 6. Thus, the highest plasma density is in regions 74, whereas the lowest density is in region 71 near the liner 32.

The ionized plasma in the chamber 6 is most free to move around in regions 74, as these regions have the lowest magnetic field strengths, whereas little or no ionized plasma exists in the outer region 71. In FIG. 4A, the electro-magnets 50a' and 50b' are energized to a relatively high level, so as to restrict the flow of ions through the pre-extraction region and into the slits 30 of the extraction electrodes 26. Thus, the extracted ion beam slice 80' draws ions largely from the region 73. However, in accordance with the present invention, other slices along the longitudinal length of a ribbon beam 80 may be adjusted differently. Referring now to FIG. 4B, an adjacent slice of the source 2 is illustrated in section, wherein the electromagnets 50a'' and 50b'' are energized to a lower level, whereby less restriction to ion extraction is provided at the pre-extraction region 56. As can be seen in FIG. 4B, the slice 80'' of the extracted beam draws ions from the lower magnetic field strength region 74. It will be appreciated that the invention provides for any combination of relative energization levels for the plurality of magnet pairs in the profile control apparatus 60, and that any number of such magnet pairs may be provided, so as to achieve any desired beam density profile.

Referring also to FIG. 5, the source 2 is illustrated in simplified form, wherein certain details such as the power sources and control systems are not shown for the sake of clarity. The source 2 provides an elongated ribbon-shaped beam 80 having a length 82 and a width 84, with a large aspect ratio. The beam is segmented into 8 portions or slices by virtue of the 8 magnet pairs 50a, 50b of the control apparatus 60, whereby the density profile of the beam 80 may be tailored to a specific application. In one implementation, the beam length 82 is about 400 mm, so as to facilitate single-scan implantation of 300 mm wafer targets or flat panel displays. However, any desired beam length 82 is possible within the scope of the invention. Moreover, any desired width 84 can be achieved, by appropriate sizing of the exit opening 18 in the source housing 4, and the slits 30 of the extraction electrodes 26. Furthermore, it is noted that the extraction electrodes 26 may be implemented in any appropriate fashion, having other than five such electrodes 26, and that the illustrated electrodes 26 are not necessarily drawn to scale.

Although the invention has been illustrated and described above with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In this regard, it will also be recognized that the invention includes a computer-readable medium having computer-executable instructions for performing the steps of the various methods of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", "with" and variants thereof are used in either the detailed description or the claims, these terms are intended to be inclusive in a manner similar to the term "comprising".

What is claimed is:

1. An ion source for providing an ion beam in an ion implantation system, comprising:
    a housing defining an elongated plasma confinement chamber disposed along a longitudinal axis in which a plasma is generated by ionizing a source material, the housing comprising a generally cylindrical electrically conductive chamber wall extending longitudinally between first and second ends thereof, respectively, with an elongated longitudinally extending exit opening through which an ion beam may be extracted from the plasma;
    an antenna comprising first and second terminals, the second terminal being electrically connected to the chamber wall at the second end, and a portion of the antenna between the first and second terminals extending longitudinally within the plasma confinement chamber along the axis for coupling energy into the plasma chamber; and
    an RF source for energizing the antenna with a radio frequency signal in a frequency range of 1 to 100 MHz, the RF source comprising a first output electrically connected to the first terminal of the antenna and a second output electrically connected to the first end of the chamber wall, the RF source, the antenna, and the chamber wall forming a substantially coaxial electrical circuit to provide an alternating electric current in the exposed portion of the antenna for inducing an ionizing electric field within the plasma confinement chamber.

2. The ion source of claim 1, further comprising a first capacitor connected between the first output of the RF source and the first terminal of the antenna.

3. The ion source of claim 2, further comprising a second capacitor connected between the second end of the chamber wall and the second terminal of the antenna.

4. The ion source of claim 1, further comprising a capacitor connected between the second end of the chamber wall and the second terminal of the antenna.

5. The ion source of claim 1, further comprising an insulating tube surrounding the antenna.

6. The ion source of claim 3, further comprising a plurality of magnets radially spaced from the axis within the plasma confinement chamber and longitudinally spaced from one another to form at least one adjacent pair, each adjacent pair being of opposite magnetic polarity so as to create longitudinal magnetic fields near the chamber wall for confinement of plasma within the plasma confinement chamber.

7. The ion source of claim 6, wherein the plurality of magnets individually extend circumferentially around a portion of the interior of the chamber wall between opposite sides of the exit opening.

8. The Ion source of claim 6, wherein the plurality of magnets are permanent magnets.

9. The ion source of claim 1, further comprising a plurality of magnets radially spaced from the axis within the plasma confinement chamber and longitudinally spaced from one another to form at least one adjacent pair, each adjacent pair being of opposite magnetic polarity so as to create azimuthal magnetic fields near the chamber wall for confinement of plasma within the plasma confinement chamber.

10. The ion source of claim 1, further comprising a cylindrical liner disposed in the plasma confinement chamber between the chamber wall and the axis in which the plasma is generated, the liner providing a thermal barrier between the plasma and the chamber wall so as to prevent condensation of the source material within the plasma confinement chamber.

11. The ion source of claim 10, wherein the liner comprises tungsten.

12. The ion source of claim 1, further comprising a plurality of extraction electrodes located outside the chamber wall proximate the exit opening, the extraction electrodes being energizable to provide electric fields for extracting an elongated ion beam from the plasma confinement chamber through the exit opening.

13. An ion source for providing an ion beam in an ion implantation system, comprising:
- a housing defining a generally cylindrical plasma confinement chamber disposed along a longitudinal axis in which a plasma is generated by ionizing a source material, the housing comprising a cylindrical electrically conductive chamber wall extending longitudinally between first and second ends thereof, respectively, with an elongated longitudinally extending exit opening through which an ion beam may be extracted from the plasma;
- an antenna partially extending within the plasma confinement chamber for emitting energy into the plasma chamber;
- an RF source forming an electrical circuit with the antenna to provide an alternating RF electric current in the antenna for inducing an ionizing electric field within the plasma confinement chamber; and
- a plurality of magnets radially spaced from the axis within the plasma confinement chamber and longitudinally spaced from one another to form at least one adjacent pair, each adjacent pair being of opposite magnetic polarity so as to create azimuthal magnetic fields near the chamber wall for confinement of plasma within the plasma confinement chamber.

14. The ion source of claim 13, wherein the plurality of magnets individually extend circumferentially around a portion of the Interior of the chamber wall between opposite sides of the exit opening.

15. The ion source of claim 13, wherein the plurality of magnets are permanent magnets.

16. The ion source of claim 13, wherein the antenna is located along the axis in coaxial relationship with the chamber wall.

17. An ion source for providing an ion beam in an ion implantation system, comprising:
- a housing comprising a cylindrical chamber wall and first and second circular end walls attached to first and second ends of the chamber wall, the housing defining a cylindrical plasma confinement chamber in which a plasma including ions is generated by ionizing a source material, the cylindrical chamber wall comprising an elongated exit opening through which an ion beam may be extracted from the plasma;
- an antenna comprising first and second terminals, the second terminal being electrically connected to the second end wall, and a portion of the antenna being coaxially located with respect to the chamber wall between the first and second terminals for emitting energy into the plasma chamber; and
- an RF source for energizing the antenna with a radio frequency signal, the RF source comprising a first output electrically connected to the first terminal of the antenna and a second output electrically connected to the first end wall, the RF source, the antenna, the chamber wall and the first and second end walls forming an electrical circuit to provide an alternating electric current in the exposed portion of the antenna for inducing an ionizing electric field within the plasma confinement chamber.

18. The ion source of claim 17, further comprising a capacitor connected between the first output of the RF source and the first terminal of the antenna.

19. The ion source of claim 17, further comprising a capacitor connected between the second end wall and the second terminal of the antenna.

20. The ion source of claim 19, wherein the antenna and the capacitor constitute a resonant circuit at a frequency of the RF source.

21. The ion source of claim 17, further comprising a plurality of magnets radially spaced from the antenna within the plasma confinement chamber and longitudinally spaced from one another to form at least one adjacent pair, each adjacent pair being of opposite magnetic polarity so as to create longitudinal magnetic fields near the chamber wall for confinement of plasma within the plasma confinement chamber.

22. The ion source of claim 21, wherein the plurality of magnets individually extend circumferentially around a portion of the interior of the chamber wall between opposite sides of the exit opening.

23. The ion source of claim 17, further comprising a cylindrical liner disposed in the plasma confinement chamber between the chamber wall and the antenna in which the plasma is generated, the liner providing a thermal barrier between the plasma and the chamber wall so as to prevent condensation of the source material within the plasma confinement chamber.

* * * * *